US012261609B1

(12) United States Patent
Sridharan et al.

(10) Patent No.: US 12,261,609 B1
(45) Date of Patent: Mar. 25, 2025

(54) INTER-PLL COMMUNICATION IN A MULTI-PLL ENVIRONMENT

(71) Applicant: Shaoxing Yuanfang Semiconductor Co., Ltd., Shaoxing (CN)

(72) Inventors: Srinath Sridharan, Bangalore (IN); Ankit Seedher, Bangalore (IN); Raja Prabhu J, Bangalore (IN); Purva Choudhary, Bangalore (IN); Sandeep Sasi, Bangalore (IN); Akash Gupta, Bangalore (IN); Jeevabharathi G, Bangalore (IN); Bhupendra Sharma, Bangalore (IN); Debasish Behera, Bangalore (IN); Nandini Ganig BS, Bangalore (IN); Chandrashekar BG, Bangalore (IN)

(73) Assignee: Shaoxing Yuanfang Semiconductor Co., Ltd., Zhejiang (CN)

( * ) Notice: Subject to any disclaimer, the term of this patent is extended or adjusted under 35 U.S.C. 154(b) by 0 days.

(21) Appl. No.: 18/489,012

(22) Filed: Oct. 18, 2023

(51) Int. Cl.
*H03L 7/099* (2006.01)
*H03L 7/093* (2006.01)

(52) U.S. Cl.
CPC .............. *H03L 7/099* (2013.01); *H03L 7/093* (2013.01)

(58) Field of Classification Search
CPC .................................. H03L 7/099; H03L 7/093

(Continued)

(56) References Cited

U.S. PATENT DOCUMENTS 5,412,353 A * 5/1995 Chaplik .................. H03L 7/093
331/23
9,444,470 B2 9/2016 Milijevic
(Continued)

FOREIGN PATENT DOCUMENTS

JP 05199109 A * 8/1993

OTHER PUBLICATIONS

Mohammadreza Jamali, et al, A new Fractional-N frequency synthesizer using Nested-PLL architecture, 2017 Iranian Conference on Electrical Engineering (ICEE), Date of Conference: May 2-4, 2017, pp. 188-192, IEEE.

(Continued)

*Primary Examiner* — Arnold M Kinkead
(74) *Attorney, Agent, or Firm* — IPHORIZONS PLLC; Narendra Reddy Thappeta (57) ABSTRACT

An electronic block includes multiple independent Phase-Locked Loops (PLLs) and a switch matrix. Each PLL has an input path and an output path. The switch matrix is operable to concurrently connect a respective signal on the output path of each PLL to the input path of another PLL. In an embodiment, each of the respective signals on the output paths is a corresponding frequency-correction signal generated by a low-pass filter (LPF) in the corresponding PLL. In an embodiment, each PLL includes a frequency-correction signal combiner to combine the frequency-correction signals received from any of the other PLLs with its own frequency-correction signal to form a combined frequency-correction signal. The combined frequency-correction signal is provided to a controlled oscillator in the PLL to generate an output clock of the PLL based on the combined frequency-correction signal. The frequency-correction signals may be analog or digital signals.

20 Claims, 7 Drawing Sheets

(58) Field of Classification Search
USPC ........ 725/105; 370/352; 709/248; 331/2, 34, 331/1 A; 375/240.28
See application file for complete search history.

(56) References Cited

U.S. PATENT DOCUMENTS

| | | |
|---|---|---|
| 10,234,895 B2 | 3/2019 | Jin et al. |
| 10,250,379 B2 | 4/2019 | Haddad et al. |
| 10,727,845 B1 | 7/2020 | Balakrishnan et al. |
| 11,296,806 B2 | 4/2022 | Coulter |
| 11,588,488 B1 | 2/2023 | Moore |
| 2001/0048329 A1 | 12/2001 | Sumi |
| 2008/0136531 A1* | 6/2008 | Kim ................. H03L 7/093 331/2 |
| 2016/0294401 A1 | 10/2016 | Jin et al. |
| 2019/0312580 A1 | 10/2019 | Spijker |

OTHER PUBLICATIONS

Mauricio Pardo, et al, A Band-Reject Nested-PLL Clock Cleaner Using a Tunable MEMS Oscillator, IEEE Transactions on Circuits and Systems I: Regular Papers, Date of Publication: Oct. 8, 2013, pp. 653-662, vol. 61, Issue: 3, IEEE.

* cited by examiner

INTER-PLL COMMUNICATION IN A MULTI-PLL ENVIRONMENT

RELATED APPLICATION

The instant application is related to co-pending U.S. Nonprovisional application Ser. No. 17/806736, entitled, "FAST SWITCHING OF OUTPUT FREQUENCY OF A PHASE LOCKED LOOP (PLL)", naming as inventors: Sridharan et al, and is in incorporated in its entirety into the instant application.

BACKGROUND

Technical Field

Embodiments of the present disclosure relate generally to Phase Locked Loops (PLL), and more specifically to inter-PLL communication in a multi-PLL environment.

Related Art

There are often environments in which multiple PLLs are employed. Example environments are network switches (e.g., Synchronous Ethernet (SyncE) switch), routers, SyncE (Synchronous Ethernet) timing cards, line cards, etc., of a telecommunication network. Each PLL may typically be designed to be a stand-alone/independent PLL to perform a specific task.

However, there are often situations in which a PLL may benefit from one or more signals (internal signals or output signals, or a combination of different signals) in another PLL or in other multiple PLLs. Various aspects of the present disclosure are directed to such inter-PLL communication in a multi-PLL environment.

BRIEF DESCRIPTION OF THE VIEWS OF DRAWINGS

Example embodiments of the present disclosure will be described with reference to the accompanying drawings briefly described below.

In the drawings, like reference numbers generally indicate identical, functionally similar, and/or structurally similar elements. The drawing in which an element first appears is indicated by the leftmost digit(s) in the corresponding reference number.

DETAILED DESCRIPTION

1. Overview

An electronic block implemented according to an aspect of the present disclosure includes multiple independent Phase-Locked Loops (PLLs) and a switch matrix. Each of the PLLs has an input path and an output path. The switch matrix is operable to concurrently connect a respective signal on the output path of each PLL to the input path of another PLL. In an embodiment, each of the respective signals on the output paths is a corresponding frequency-correction signal generated by a low-pass filter (LPF) in the corresponding PLL.

In an embodiment, each PLL includes a frequency-correction signal combiner to combine the frequency-correction signals received from any of the other PLLs with its own frequency-correction signal to form a combined frequency-correction signal. The combined frequency-correction signal is provided to a controlled oscillator in the PLL to generate an output clock of the PLL based on the combined frequency-correction signal. The frequency-correction signals may be analog or digital signals.

2. Multi-PLL Environment and Inter-PLL Communication

Figure 1:
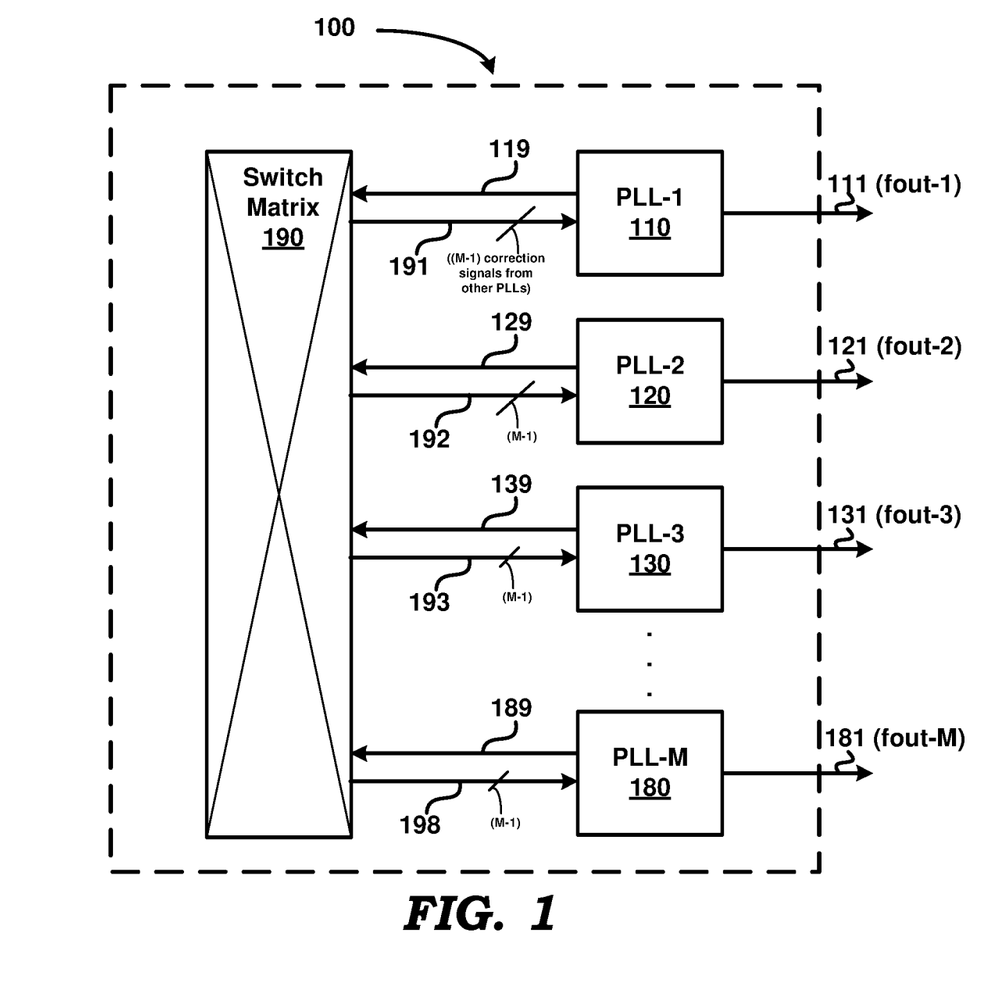
FIG. 1 is a block diagram illustrating the details of an example environment in which several aspects of the present disclosure can be implemented.

FIG. 1 is a block diagram of an electronic device or block in an embodiment of the present disclosure. Integrated Circuit (IC) 100 is shown containing multiple (M) PLLs (Phase Locked Loops) PLL-1 through PLL-M and switch matrix 190. 'M' is any integer greater than 1. Although shown as implemented as an IC, the techniques of the present disclosure are applicable even when the various blocks of FIG. 1 are implemented separately (for example, as separate ICs or discrete circuits). Further, the PLLs may be implemented to be all-digital or all-analog PLLs, in which the blocks of the PLL are either all digital or all analog. Alternatively, the PLLs may be implemented as a combination of analog and digital blocks.

It is noted here that although the description below is provided in the context of an integrated circuit (IC 100), the techniques of the present disclosure are applicable even if the various blocks of FIG. 1 are implemented separately (for example, as separate ICs or discrete circuits). The details of implementation of the PLLs are provided below with examples.

The 'M' PLLs (M being any integer greater than 1) are shown numbered 310, 320, 330 and 380. The clock outputs of the PLLs are denoted respectively as fout-1 (111), fout-2 (121), fout-3 (131) and fout-M (181). Each of the M PLLs is capable of independent operation, i.e., each of the M PLLs contains internal components that together can normally operate to generate a corresponding output clock locked to a respective source/reference clock.

According to aspects of the present disclosure, one or more signals from each PLL is made available as inputs to the other PLLs via a suitable routing network such as switch matrix 190. Thus, each otherwise-independent PLL can be assisted by information from another PLL via switch matrix 190 as described further below, and corresponding benefits may thereby be obtained.

Switch matrix 190 operates to route one or more outputs from each PLL (of FIG. 1) to corresponding inputs of one or more other PLLs (of FIG. 1). Switch matrix 190 may be implemented to contain an array of switches that are controllable to be OPEN or CLOSED to electrically connect or disconnect corresponding rows to/from corresponding columns (the row and columns being electrically conducting paths or wires) to effect/cause the desired routing between the outputs of the PLLs and inputs of other PLLs. In an embodiment of the present disclosure, switch matric 190 is implemented as an analog switch matrix with analog/RF (Radio Frequency) switches that can pass/block both analog/RF and digital signals, and support information about a wide range of signal frequencies. In an alternative embodiment, in which the signals of the PLLs coming into and leaving switch matrix 190 are digital signals, switch matrix 190 may be implemented as a digital switch matrix using digital logic blocks and tristate-able buffers. The configuration/routing information for switch matrix 190 is to provide the desired interconnections to cause the desired connections of the signals from a source PLL to a destination PLL(s) may be performed by a user via an external device (e.g., computer) or be in the form of embedded code. As an example, the configuration can be caused by execution of boot-code in switch matrix 190 (or in a memory external to switch matrix 190) upon power-UP or RESET of switching matrix 190 or the system that includes IC 100 and switch matrix 190.

In FIG. 1, switch matrix 190 is shown as receiving signals 119, 129, 139 and 189 respectively from PLLS 110, 120, 130 and 180. The paths 119, 129, 139 and 189 may be viewed as output paths from the respective PLLs to switch matrix 190. In an embodiment of the present disclosure, signals 119, 129, 139 and 189 are the outputs of the low-pass filters of the respective PLLs.

Each of paths 191, 192, 193 and 198 represents multiple (M-1) signals received from other corresponding PLLs. Paths 191, 192, 193 and 198 may be viewed as input paths to the corresponding PLL from switch matrix 190.

As an example, path 191 may represent (M-1) separate signals from the output of the low-pass filters (LPF) of PLL2 through PLL-M respectively. Similarly, path 192 may represent (M-1) separate signals from the output of the low-pass filters (LPF) of PLL-1 and PLL-3 through PLL-M. The signals in a set of (M-1) output signals (e.g., 191) of switch matrix 190 may be connected to desired nodes within the corresponding PLL (e.g., PLL-1). Various examples of such connections are noted in sections below.

The specific signals noted above are provided merely to illustrate. In general, any number and set of desired signals from one PLL can be provided to one or more of the other PLLs via switch matrix 190. For example, the LPF output of a PLL can be arithmetically combined with one or more LPF outputs of another PLL or of multiple other PLLs, and the arithmetic combination (sum, difference, etc.) can be made available as input to switch matrix 190 (not shown in FIG. 2) for forwarding to one or more of the other PLLs. In addition to arithmetic operations, or alternatively, the combining can include filtering (such as low-pass filtering, high-pass filtering, etc.) of one or more of the signals that are combined, or the filtering of the combined signal itself.

Switch matrix 190 is programmable (via inputs not shown) to cause a desired set of signals from each PLL to be provided concurrently (simultaneously) to one or more of the other PLL(s). As an illustration, the signal received on path 119 may be provided to one or more of PLLs 2-M, while a signal received on path 139 may also be provided to one or more of PLLs 1, 2, 4-M at the same time (concurrently/simultaneously). The desired inter-connections may be effected by a logic core or processor internal or external to IC 100 designed to program the desired routing in switch matrix 190, in response to user configuration commands from an external computer via suitable interfaces. It is also noted here that switch matrix may be implemented in the form of fixed (non-programmable) routing circuitry instead of programmable circuitry. In general, switch matrix 190 may be implemented in a known way.

Figure 2:
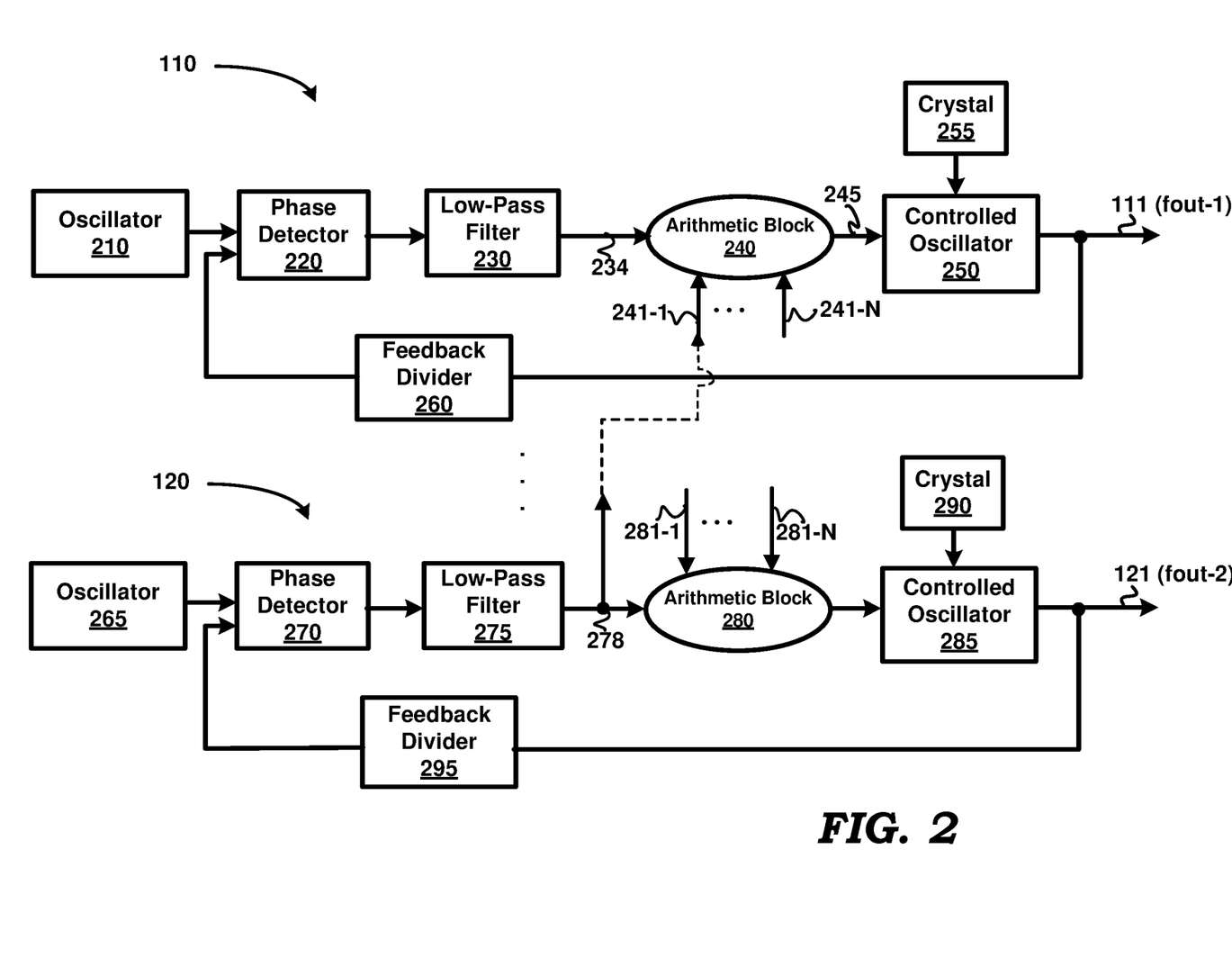
FIG. 2 is a block diagram illustrating the interconnections between a pair of PLLs (Phase Locked Loops) in an embodiment of the present disclosure.

FIG. 2 is a block diagram illustrating the details of a pair of PLLs in IC 100 along with the interconnections between them (via switch matrix 190-which is not shown in FIG. 2). PLLs 110 and 120 are shown there. The details of FIG. 2 are meant merely to better illustrate the signal transfer between PLLs (i.e., inter-PLL communication) according to aspects of the present disclosure. Hence, only the fundamental blocks of the PLLs are shown. In addition, it should be understood that similar communication would exist between pair of the M PLLs shown in FIG. 1.

PLL 110 is shown containing oscillator 210, phase detector 220, low-pass filter (LPF) 230, arithmetic block 240, controlled oscillator 250, crystal 255 and feedback divider 260. PLL 120 is shown containing oscillator 265, phase detector 270, LPF 275, arithmetic block 280, controlled oscillator 285, crystal 290 and feedback divider 295. The description of the implementation of the blocks of a PLL (such as PLLs 110 and 120 of FIG. 2) in example embodiments of the present disclosure are provided in sections below, and only the connections and operations of the arithmetic block are briefly described here. However, it is noted briefly here that instead of receiving a reference clock (or a source clock from which the reference clock is obtained by frequency division) from its own main oscillator (e.g., 210 and 265 for PLLs 110 and 120 respectively), each of PLLs 110 and 120 (as well as the other PLLs in IC 100, in general) can instead receive its reference clock (or source clock) from an external source, an example of which is noted below with respect to FIG. 7.

Arithmetic block 240 is shown receiving signals on paths 234 and 241-1 through 241-N. Signal 234 represents the output of LPF 230. Signals 241-1 through 241-N represent the outputs of the corresponding LPFs of the other PLLs in IC 100. Arithmetic block 280 is shown receiving signals on paths 278 and 281-1 through 281-N. Signal 278 represents the output of LPF 275. Signals 281-1 through 281-N represent the outputs of the corresponding LPFs of the other PLLs in IC 100.

Signals 234 and 278 (and LPF outputs of a PLL in general), being filtered error signals that change the output frequency of the respective controlled oscillator, may be referred to as 'frequency-correction signals'.

In FIG. 2, frequency-correction signal 278 of LPF 275 is shown as being routed (via switch matrix 190) to path 241-1 and thus as an input to arithmetic block 240. In FIG. 2, it is assumed that no signals are received on paths 241-2 through 241-N. Arithmetic block 240 combines the respective LPF outputs 234 and 278, and forwards the result of the combining to controlled oscillator 250 on path 245. In an embodiment, the combining operation is addition. Example benefits of using a combined frequency-correction signal are described in sections below. An arithmetic block described herein (e.g., 240 and 280) may be viewed as a frequency-correction signal combiner.

Figure 3:
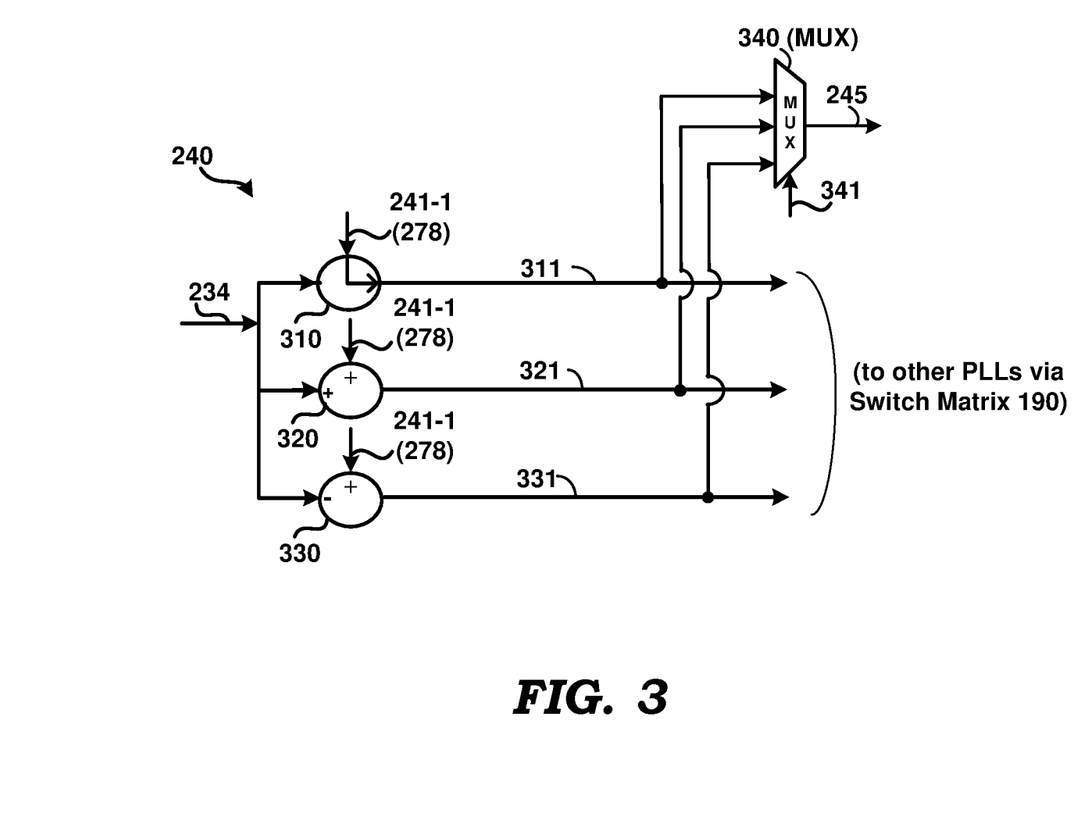
FIG. 3 is a block diagram illustrating the manner in which a frequency-frequency-correction signal generated in a PLL is combined with a frequency-frequency-correction signal from another PLL, in an embodiment of the present disclosure.

FIG. 3 is a diagram illustrating some example ways of combining frequency-frequency-correction signals in an embodiment of the present disclosure. An example implementation of arithmetic block 240 is shown there.

Blocks 310, 320 and 330 respectively represent the operations of 'no operation', addition and subtraction. Thus, block 310 forwards frequency-frequency-correction signal 278

(received on path 241-1) on to path 311 without combining with frequency-frequency-correction signal 234. Block 320 adds frequency-frequency-correction signals 234 and 278 forwards the sum on path 321. Block 330 subtracts frequency-frequency-correction signals 234 and 278 forwards the difference on path 321. Each of signals 311, 321 and 331 are forwarded to respective inputs of switch matrix 190 for routing to other PLLs. In the embodiment, arithmetic block 240 contains a multiplexer (MUX 340), and signals 311, 321 and 331 are available at the inputs of MUX 340. A control signal 341 with the corresponding value causes MUX 340 to forward the corresponding input to output path 245.

Merely for illustration, in FIG. 3 only combining of frequency-frequency-correction signal of two PLLs is shown performed by arithmetic block 240. However, in other embodiments, arithmetic block 240 can combine frequency-frequency-correction signals from multiple PLLs using any combination of arithmetic operations. In general, other combination or combinations (logical, differential/rate of change, etc.) of two or more of the frequency-frequency-correction signals can also be generated by an arithmetic block (or alternatively for some operations such as rate-of-change, by the corresponding PLLs). For example, the sum of all the frequency-frequency-correction signals in the multi-PLL environment can be generated and provided via switch matrix 190 to all PLLs or only a desired subset of PLLs. As another example, a desired combination of the sums and differences of frequency-correction signals can be generated and provided to all PLLs or to a subset of the PLLs. The combined correction output on path 245 (as well as corresponding paths in the other PLLs may be referred to as the 'combined signal' or the 'final frequency-correction signal' of that PLL.

It is noted here, that the select signals for multiplexers such as MUX 340 in IC 100 may be configured by a user via an external device (e.g., computer) or be in the form of configuration data in boot-code stored in PLL 110. As an example, the select signal for the multiplexers noted above can be provided by execution of boot-code in IC 100 (or an external boot memory) upon power-UP or RESET of IC 300, the system employing IC 100 and switch matrix 190 or of the individual PLLs in IC 100.

Thus, the combining operations in one or more PLLs can be continuously operative upon power-up of the PLL(s)/IC 100 or following RESET such that the latest/current values of the frequency-correction signals are used for the combining operation. Alternatively, the combining operation can be made operative only at desired time instances based on considerations such as, for example, the time of occurrence of some event such as changing (e.g., by a user) a PLL's control parameters to obtain a new output frequency. Thus, both final steady-state values of frequency-correction signals or non-steady-state values (as in when a frequency-correction signal is changing (transient) but not yet settled to its steady-state value) can be used for the combining. It is noted here that even a transient value of a frequency-correction signal transmitted to another PLL can assist the receiving PLL to settle to it's steady-state "faster". Boot-code noted herein may contain data for initializing/triggering the combining operation. Alternatively, external user-input can be used for such triggering.

By making a frequency-correction signal of one PLL or a combination of frequency-correction signals of multiple PLLs available to other PLLs, several benefits may be obtained, as briefly described next with examples.

Figure 4:
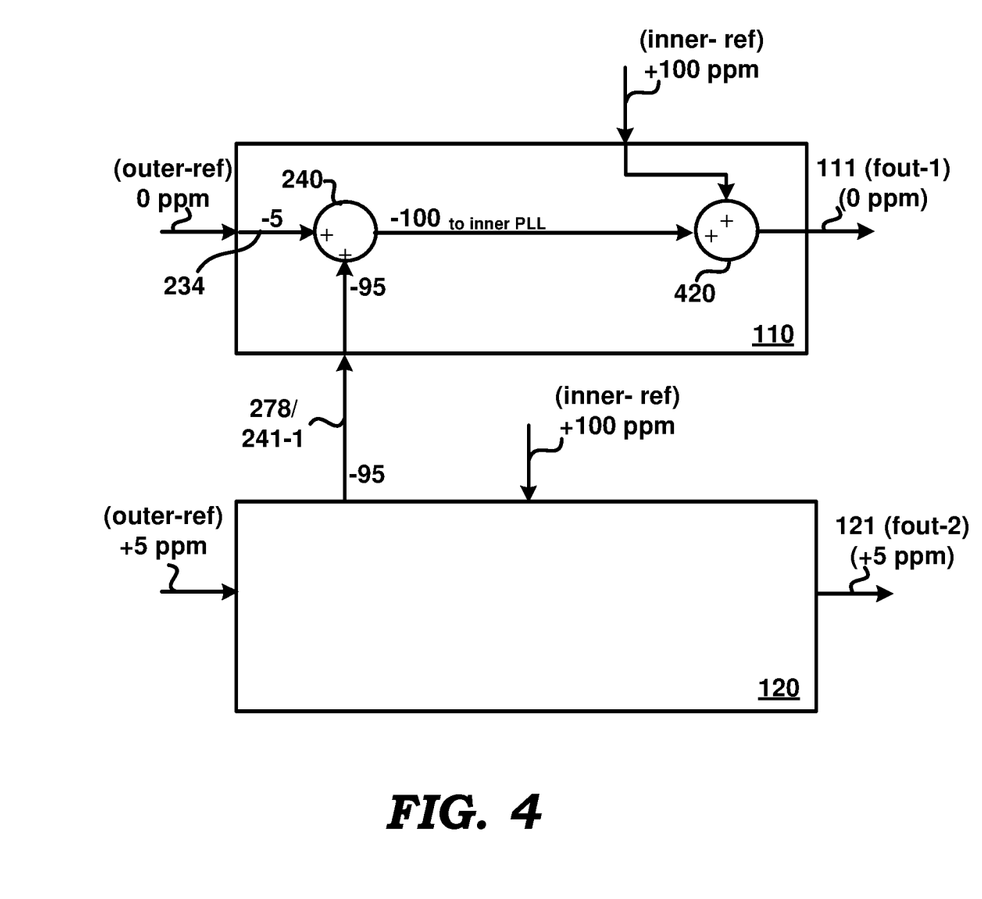
FIG. 4 is a diagram used to illustrate the manner in which a PLL is designed to switch its output clock frequency faster and maintain its output clock frequency stable even upon loss of its input clock.

3. Maintaining a Low-clock-drift Output Frequency upon Loss of Input Clock and Enabling Fast Switching of PLL outputs by Reducing Slow Transients The techniques described above enable a PLL to maintain its output clock frequency stable, i.e., with minimal or low clock-drift, even upon loss of its input clock. FIG. 4 is used to illustrate such capability and is shown containing PLL 110 and PLL 120 (of FIG. 2). In FIG. 4, 'outer-ref' represents the reference clock of the corresponding PLL, while 'inner-ref' represents the default frequency of the controlled oscillator. The default frequency of the controlled oscillator is the frequency of the clock output of the controlled oscillator in the absence of any frequency-correction from the arithmetic block or LPF of the PLL. When the controlled oscillator is itself implemented as another PLL (inner PLL) as described in sections below, the default frequency is the frequency of the reference clock of the inner PLL.

With combined reference to FIG. 2 and FIG. 4, outer-ref of PLL 110 is the reference clock frequency generated by oscillator 210, while outer-ref of PLL 120 is the reference clock frequency generated by oscillator 265. Inner-ref of PLL 110 is the default output clock frequency of controlled oscillator 250 (or the reference clock frequency of an inner-PLL implementing controlled oscillator 250), while inner-ref of PLL 120 is the default output clock frequency of controlled oscillator 285 (or the reference clock frequency of the inner-PLL implementing controlled oscillator 285).

In an embodiment of the present disclosure, oscillators 210 and 265 are implemented as high-stability/low-drift oscillators such as, for example, temperature-compensated crystal oscillators (TCXO) or oven-controlled crystal oscillators (OCXO). Controlled oscillators 250 and 285 are implemented as relatively (inexpensive) low-stability/high-drift oscillators. In the examples described herein, oscillators 250 and 285 are shown as crystal oscillators with voltage-control. Thus, the outer-ref clocks and the inner-ref clocks in FIG. 4 are respectively high-stability/low-drift clocks and relatively low-stability/high-drift clocks. In other embodiments, other types of oscillators can instead be used in place of the corresponding oscillators noted herein.

The signal frequencies in FIG. 4 are indicated in terms of ppm (parts per million). As used herein, +/−X ppm means a frequency that is away from a base frequency by X ppm, i.e., X ppm above the base frequency or X ppm below the base frequency. To illustrate with an example, assuming the base frequency is 100 Mega Hertz (MHz), a clock with a frequency expressed as −100 ppm would have a value [100* (1−(100/1000000))] MHz, i.e., 99.99 MHz (Mega Hertz). In the example of FIG. 4, outer-ref and inner-ref of PLL 110 are respectively 0 ppm and +100 ppm, while outer-ref and inner-ref of PLL 120 are respectively +5 ppm and +100 ppm. In the embodiment, both of the inner-ref clocks are assumed to have equal frequencies and similar stability/drift characteristics. Further, the two inner-ref clocks can be obtained from a same source clock.

In the description below, the frequency division in each of feedback dividers 260 and 295 is assumed for simplicity to be one. Block 420 conceptually represents the frequency-correction operation obtained by applying the final frequency-correction signal of PLL 110 to bring the output frequency of controlled oscillator/inner-ref 250 to 0 ppm.

Without the techniques disclosed herein, i.e., without the availability in a PLL of the frequency-correction signals (and/or combinations thereof) from other PLLs and the facility for combining multiple frequency-correction signals and using the resulting combined signal to control the frequency of the controlled oscillator, each PLL would effectively operate independently of all other PLLs. In such a prior scenario, the frequency-correction signal 234 would be directly provided (on path 245) to the controlled oscillator 250 and would have been -100 (i.e., the difference [0 ppm-100 ppm]) to provide fout-1 (111) with a frequency of 0 ppm. The frequency-correction signal 278 is -95 (i.e., the difference [+5 ppm-100 ppm]) to provide fout-2 (121) with a frequency of +5 ppm.

However, employing the techniques disclosed herein, the frequency-correction signal 278 of PLL 120 is added to the frequency-correction signal 234, and the sum of the two is forwarded on path 245. Since frequency-correction signal 278 (received by arithmetic block 240 on path 241-1 as shown in FIG. 2) of −95 is added to frequency-correction signal 234, frequency-correction signal 234 changes to −5 9 as shown in FIG. 4) due to operation of the feedback loop of PLL 110, since the total correction needs to be −100 (on path 245).

Upon loss of outer-ref clock of 0 ppm in PLL 110, PLL 110 is immediately set to operate in 'hold-over' mode. In hold-over mode, the frequency-correction signal 234's value of −5 is maintained. That is upon loss of outer-ref clock of 0 ppm, the frequency-correction signal 234 is maintained at the last-known value of −5. PLL 110 continues to generate the same frequency (i.e. 0 ppm) as before loss of clock.

With the loss of outer-ref clock of 0 ppm, the feedback loop of PLL 110 will effectively be inoperative and unable to correct any drift in inner-ref clock (controlled oscillator 250 is assumed to be a low-stability/high-drift clock). Consequently, had frequency-correction signal 278 not been provided to, and used in, PLL 110 as noted above, frequency drift of inner-ref clock would have caused output frequency fout-1 (111) to also drift correspondingly. The frequency drift of inner-ref clock may be on account of factors such as change in operating temperature, component aging, etc., as is well known in the relevant arts.

However, since the correction of −100 ppm is made up of contribution of −5 ppm from PLL 110 and −95 ppm from PLL 120, the output frequency fout-1 does not drift as much as it would have if all of the correction of −100 ppm had come from PLL 110. Since the inner-ref clocks of both PLL 110 and 120 have the same frequency as well as drift-characteristics, any drift in inner-ref clock of PLL 110 would be offset by a corresponding (substantially equal) drift in the inner-ref clock of PLL 120.

To illustrate with an example, if the drift of inner-ref clock of PLL 110 were +5 ppm (i.e., its frequency becomes +105 ppm), the frequency fout-1 would have drifted to +5 ppm in the absence of a correction component from PLL 120. That is, frequency fout-1 would have been (−100 ppm+105 ppm), i.e., +5 ppm instead of 0 ppm. However, the frequency of the inner-ref clock of PLL 120 would also drift to +105 ppm, and frequency-correction signal 278 would drift from −95 ppm to −100 ppm. Due to the contribution from frequency-correction signal 278 of PLL 120, the frequency of fout-1 is now (−5 ppm-100 ppm+105 ppm), which is 0 ppm. That is, due to similar or identical drifts in the inner-ref clocks of the two PLLs and using a combined (final) frequency-correction signal as input to the controlled oscillator, the drift in the output frequency is eliminated or at least minimized. Such capability allows the inner-ref clock of a PLL in IC 100 to be a relatively inexpensive high-drift clock while still allowing the PLL to continue to provide a stable output frequency.

It may also be appreciated that due to the combining of frequency-correction signal 278 from PLL 120 whose outer-ref clock of +5 ppm is available and therefore whose feedback loop is still operational, PLL 110 in effect may be viewed as still operating with a 'feedback loop' despite loss of its outer-ref of 0 ppm.

Similar techniques can be used for operating one or more of the other PLLs to provide/maintain a low-clock-drift output frequency even upon loss of the corresponding outer-ref clock.

It may be appreciated from the description above that the routing and use of a frequency-correction signal from one PLL (e.g., PLL 120) to another PLL (e.g., PLL 110) effectively represents a sharing of information that appears in the numerator of the frequency-calculation formula 'fout=N*f-reference', wherein fout is the output clock frequency of a PLL, N is the divisor employed by the feedback divider of the PLL, and f-reference is the frequency of the reference clock of the PLL.

To clarify, the information 'contained' in a frequency-correction signal is representative of the divisor (N) of the feedback divider of the PLL, the divisor (N) being in the numerator of the frequency-calculation formula for 'fout' noted above.

Another application of inter-PLL communication as described above is the fast-switching of a PLL in a multi-PLL environment to a new frequency by using a frequency-correction signal from another PLL(s). Employing inter-PLL communication as illustrated above, the output frequency of a first PLL (in IC 100) operating in hold-over mode can be changed very fast (ideally instantly) to another (known/desired) frequency by combining the frequency-correction signal (maintained constant in hold-over mode) of the first PLL with the frequency-correction signal of another (second) PLL. The output frequency of the second PLL is changed fast (in the manner described below) to cause its own frequency-correction signal to settle fast to a new value/magnitude corresponding to the second PLL's new output frequency. In the first PLL, since the local frequency-correction signal is combined with (e.g., added to) the frequency-correction signal of the second PLL, the output frequency of the first PLL changes quickly to a new value. By appropriately selecting the value of the new output frequency of the second PLL, the first PLL's output frequency can be changed quickly to a new desired value. The change in the output frequency of the first PLL would be as fast as that of the first PLL. Such a capability allows a PLL to be switched quickly to a different output frequency via or by another PLL.

The description is continued with an example implementation of a PLL of IC 100 in an embodiment of the present disclosure.

4. Example Implementation

Figure 5:
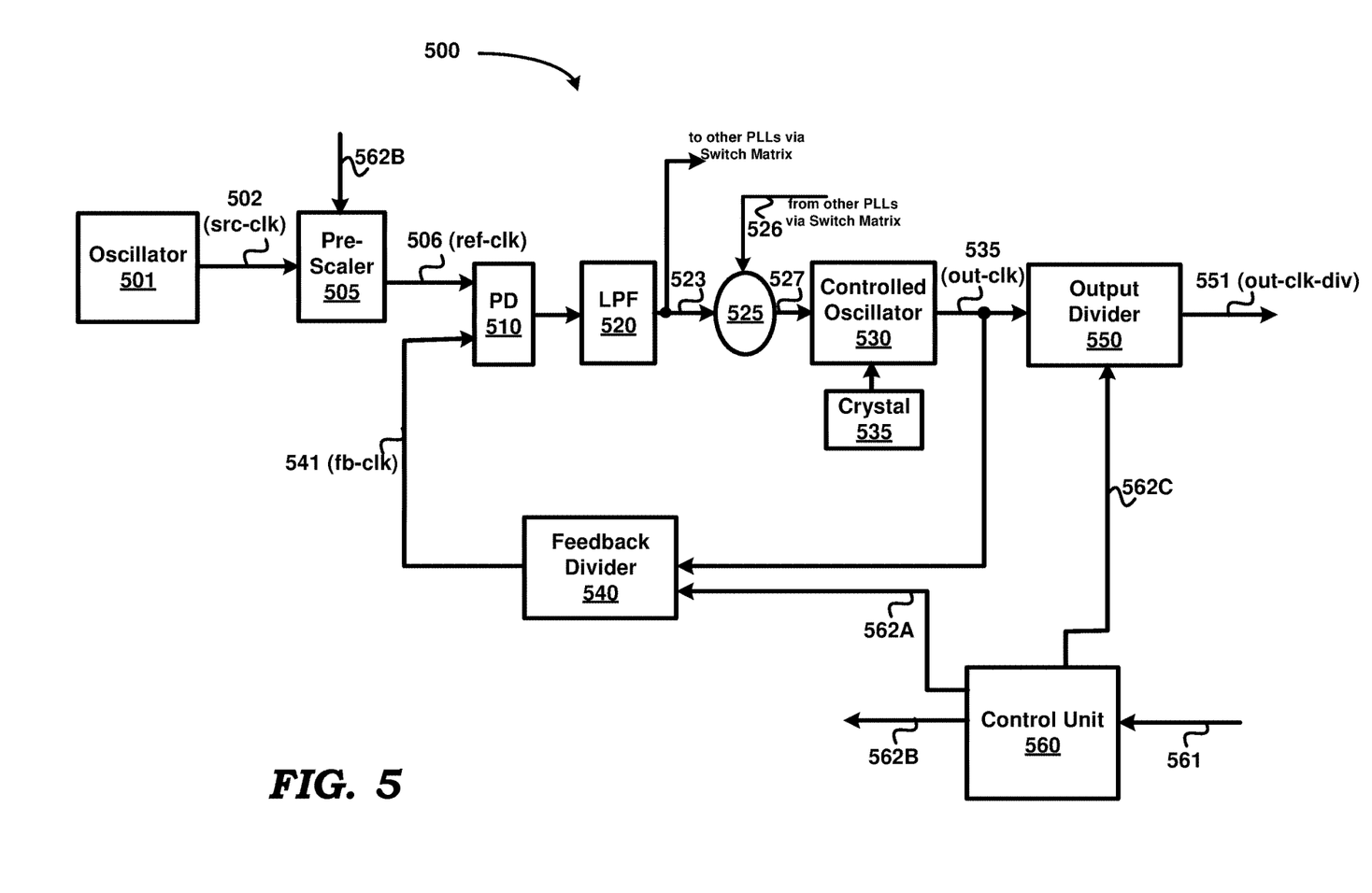
FIG. 5 is a block diagram of an example PLL that can be deployed in a multi-PLL environment, in an embodiment of the present disclosure.

FIG. 5 is a block diagram illustrating the implementation details of a PLL (e.g., PLLs 110, 120, 130 and 180) in IC 100 of FIG. 1, in an embodiment of the present disclosure. PLL 500 is shown there containing oscillator 501, pre-scaler 505, phase detector (PD) 510, low-pass filter (LPF) 520, arithmetic block 525, controlled oscillator 530, crystal 535, feedback divider 540, output divider 550 and control unit 560. The components and blocks of FIG. 5 are shown merely by way of illustration. When implemented using mostly analog components (such LPF 520 as an analog filter), PLL 500 may contain a charge pump between PD 510 and LPF 520. In alternative embodiments, PLL 500 may contain more, fewer or differently-implemented blocks. For example, PLL 500 can be implemented as an all-digital PLL (ADPLL) with PD 510 implemented as a time-to-digital converter (TDC), a digital filter in place of LPF 520 and controlled oscillator 530 implemented as a digitally-controlled oscillator (DCO) or numerically controlled oscillator (NCO). PLL 500 may also be implemented as a fully analog PLL, fully digital PLL or as a combination of analog and digital blocks, as would be apparent to one skilled in the relevant arts.

It is also noted here that PLL 500 is a more generalized depiction and implementation of PLLs 110 and 120 as shown in FIG. 2. For example, with respect to the details of PLL 110 shown in FIG. 2, oscillator 210, phase detector 220, LPF 230, arithmetic block 240, controlled oscillator 250, crystal 255 and feedback divider 250 respectively correspond to oscillator 501, phase detector (PD) 510, LPF 520, arithmetic block 525, controlled oscillator 530, crystal 535 and feedback divider 540. Pre-scaler 505, output divider 550 and control unit 560 and some of the related connections from/to these components are not shown in FIG. 2 for conciseness. Further, pre-scaler 505 and output divider 550 are optional components.

Oscillator 501 represents a high-stability/low-drift source of a source clock (src-clk) 502, and may be implemented, for example, as a TCXO or an OCXO. Pre-scaler 505 represents a frequency divider and divides the frequency of src-clk by a value received on path 562B to generate reference clock 506 (ref-clk). In alternative embodiments, oscillator 501 may not be implemented, and PLL 500 receives its reference clock (or source clock) from an external source.

PD 510 receives ref-clk and feedback clock 541 (fb-clk), and generates an error signal representing the phase difference between ref-clk and fb-clk. The phase difference may be obtained based on the times of occurrences of the rising (or falling) edges of clocks 506 and 541, or using other techniques.

LPF 520 receives the error signal generated by PD 510, and performs low-pass filtering of the error signal to generate a filtered error signal on path 523. Depending on the specific implementation of PLL 500, the filtered error signal (frequency-correction signal) can be in the form of a current or voltage or digital values. Signal 523 is made available, (e.g., via a switch matrix such as 190 of FIG. 1), as an output of PLL 500 for use in other PLLs in IC 100.

Arithmetic block 525 receives one or more frequency-correction signals from other PLLs via paths 526 and combines the received frequency-correction signals with frequency-correction signal 523 to generate a final frequency-correction signal 527.

Controlled oscillator 530 receives final frequency-correction signal 527 and generates output clock 535 (out-clk) at a frequency determined by the strength (represented by the signed magnitude) of final frequency-correction signal 527. Output divider 550 is a frequency divider and divides the frequency of out-clk to generate a divided output clock 551 (out-clk-div). Either one of clocks out-clk and out-clk-div can correspond to the output clocks fout-1 through fout-M shown in FIG. 1.

Feedback divider 540 represents a frequency divider, receives out-clk as an input and divides the frequency of out-clk by a number (divisor) received on path 562A to generate fb-clk. Feedback divider 540 may be implemented as an integer-only divider or a fractional divider that can divide by fractions (a number of the form M.N, with M and N being integers and "." representing the decimal point). As is well known in the relevant arts, one way to implement a fractional divider is by using a delta-sigma modulator (DSM) to generate a sequence of divisor values (all integers) so that the effective division by a dividing circuitry within feedback divider 540 is so as to divide out-clk by the desired fraction.

Control unit 560 receives one or more user inputs on path 561 (which may represent a single path or multiple paths) from a user device (e.g., microprocessor system, general-purpose computer, etc.) or from an internal configuration/boot-memory (not shown). Input 561 may be provided in a suitable format and specifies the desired frequencies for out-clk and out_clk_div. Alternatively, input 561 may contain divisor values to be used by feedback divider 540, pre-scaler 505 and output divider 550. Accordingly, control unit 560 either forwards the divisor values to the respective dividers, or computes corresponding values (numbers) on paths 562A, 562B and 562C and forwards the values to feedback divider 540, pre-scaler 505 and output divider 550 such that out-clk and out-clk-div are generated with the desired frequencies. Control unit 560 may be implemented to have logic internally needed for deriving the divisor values from the user input 561. Alternatively, or additionally, control unit 560 may internally contain registers to store the divisor values provided on path 561.

PLL 500 is typically implemented to have a very narrow bandwidth (for example, of the order of a few milli-Hertz to a few Hertz (Hz)). Hence, LPF 520 may be implemented with a very narrow pass-band/bandwidth. Further, the gain provided by PD 510 and controlled oscillator 530 may be correspondingly small to minimize jitter in out-clk. Due to the low bandwidth of PLL 500, any (large) change in frequency of out-clk typically requires a substantially long time. Thus, PLL 500 may be referred to as a jitter-attenuating PLL.

There are several environments in which a change to a known new frequency (from the current frequency) of out-clk (535) is required. For example, a very frequent requirement with respect to jitter-attenuating PLLs is to perform a known frequency change in the frequency of the output clock 535. A user can initiate the change by providing the corresponding divisor value needed to effect the change in frequency to feedback divider 540 (or alternatively to pre-scaler 505 or both). However, the very low bandwidth of PLL 500 translates to a very large time before the new frequency reaches the desired value from the time the change is initiated.

A known frequency change in out-clk can be achieved very quickly, as described next.

5. Inner PLL and Fast Frequency Change

In an embodiment of the present disclosure, controlled oscillator 530 is implemented as another (second or inner) PLL, and affords many frequency modification points therein (i.e., in the second/inner PLL) for fast frequency change of out-clk. To distinguish PLL 500 from the second/inner PLL, PLL 500 may be viewed as the first/outer PLL. The term 'nested' is used to signify that the controlled oscillator of a main PLL is implemented as another (inner) PLL, with the main PLL (or the combination of the outer and inner PLLs) being termed a 'nested PLL'. Thus, in an embodiment of the present disclosure, one or more of the PLLs in IC 100 may be implemented as nested-PLL(s).

The bandwidth (BW) required of the inner PLL does not need to be narrow and therefore can be very high. Further, the BW of the inner PLL may be substantially decoupled from (or independent of) the bandwidth of the outer PLL. Therefore, by changing the parameters (configuration) of the high-BW inner loop (i.e., inner PLL) at one or more locations (as noted below) in addition to changing the divisor(s) of feedback divider 540 and/or pre-scaler 505, a fast change in frequency of out-clk (535) of PLL 500's output clock can be achieved. Alternatively, or in addition, a frequency of the clock source in the outer PLL can also be changed. In general, changes to the respective parameters of the outer PLL as noted above may be viewed as a change in configuration of the outer PLL.

Figure 6:
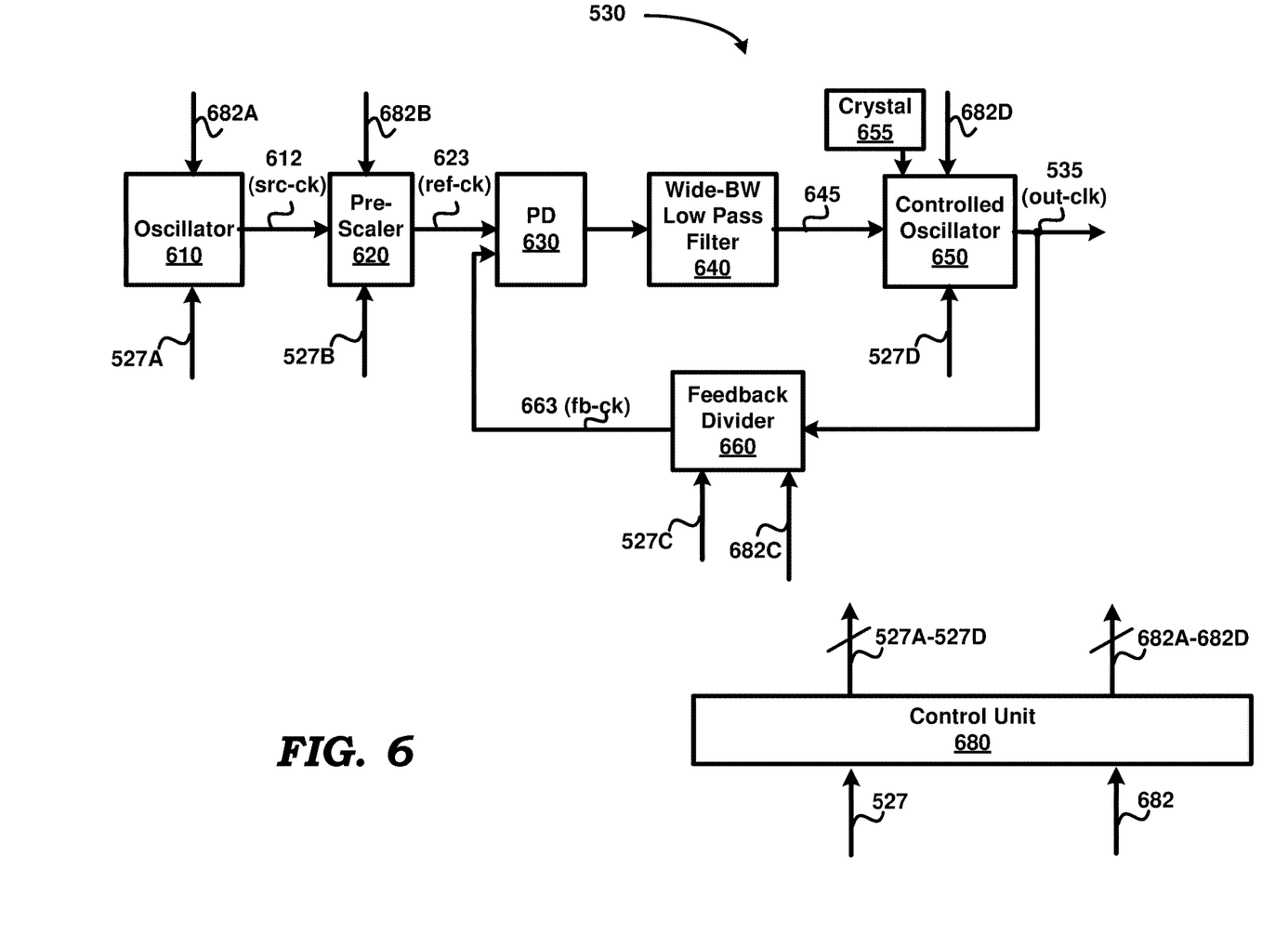
FIG. 6 is a block diagram of an inner-PLL used in place of a controlled oscillator of an outer-PLL as in FIG. 5, in an embodiment of the present disclosure.

FIG. 2 is a block diagram of the implementation of controlled oscillator 530 as another (second or inner) PLL. The inner PLL 130 is shown containing reference oscillator 210 (or 'source oscillator'), pre-scaler 220, PD 230, wide-BW LPF 240, controlled oscillator 250, feedback divider 260, output divider 270 and control unit 280. In some embodiments, wide-BW LPF 240 is not implemented at all thereby making the inner PLL to have a very large bandwidth. Alternatively, LPF 240 is implemented with a BW that is significantly larger compared to (e.g., several times) the bandwidth of the outer PLL. To distinguish between the corresponding blocks of the outer and inner PLLs that perform similar/same type of operations, such blocks are prefixed with the word "inner" or "outer" for quick reference.

Oscillator 610 generates another source clock src-ck (612) as an output. In an embodiment, oscillator 610 may be implemented as a low-stability/high-drift inexpensive crystal oscillator. Inner pre-scaler 620 represents a frequency divider and receives src-ck. Inner pre-scaler 620 also receives an input on path 682B from control unit 680. Inner pre-scaler 620 divides the frequency of src-ck by a value received on path 682B to generate reference clock 623 (ref-ck).

Inner PD 630 receives ref-ck and feedback clock 663 (fb-ck), and generates an error signal representing the phase difference between ref-ck and fb-ck. Wide-band LPF 640 (inner LPF) receives the error signal generated by inner PD 630, and performs low-pass filtering of the error signal to generate a filtered error signal on path 645.

Inner controlled oscillator 650, which may also be a low-stability/high-drift crystal oscillator (crystal 655 is shown in FIG. 6) receives filtered error signal 645 and generates out-clk (533) at a frequency whose value is determined by the strength of filtered error signal 645.

Inner feedback divider 660 represents a frequency divider and receives out-clk (535) as an input. Inner feedback divider 660 divides the frequency of out-clk by a number (divisor) received on path 682A to generate feedback clock fb-ck 663. In the case of fractional division, inner feedback divider may include a delta-sigma modulator (DSM) to receive the value on path 682A, and to generate a sequence of divisor values to be used successively by the division circuitry in feedback divider 660, as is well known in the relevant arts. Feedback divider 660 may be implemented similar to outer feedback divider 540.

There are multiple ways by which the inner PLL (530) can be controlled. In other words, there are multiple ways in which the error value (whether in digital form or analog) on path 527 can be propagated within inner PLL 530 to thereby control the inner PLL to perform the operations needed of a controlled oscillator in a PLL. For example, in one embodiment, a correction is applied to oscillator 610 on control path 527A. In another embodiment, or additionally, the divide factor applied by pre-scaler 620 is set by the outer PLL via control path 527B. In yet another embodiment, the divide factor used by the inner PLL's feedback divider 660 is set by the outer PLL via path 527C. It is noted here that a combination of two or more of the above-noted control techniques can be used instead of just one, as would be apparent to one skilled in the relevant arts. Further, the inner PLL (530) can also be controlled by adjusting the output frequency (out-clk) of controlled oscillator 650 via path 527D. It is also noted that any change to controlled oscillator 650 may be in addition to a corresponding change in feedback divider 660 and/or pre-scaler 620 and/or oscillator 610.

Thus, the inner PLL can be controlled at one or more of the 'points of control'-oscillator 610, pre-scaler 620, controlled oscillator 650 and feedback divider 660—to cause a response to signal 527 of FIG. 5, with the respective control paths being represented by 527A-527D. Accordingly, the inner PLL is shown as containing a control unit 680 that receives the value on path 527 of the outer PLL. Control unit 680 is implemented to translate the value 527 to one or more corresponding values on control paths 527A-527D to cause the response.

Paths 682A-682D may be viewed as 'configuration paths' via which the inner PLL may be configured for initial operation. For example, a user may provide on path 682 an input value specifying the initial value of output frequency 535. Control unit 680 may translate value 682 to one or more values on configuration paths 682A-682D to initialize the inner PLL. Similarly, any desired change in the output frequency 535, i.e., a new output frequency 535, is specified by user inputs on paths 561 (of FIGS. 5) and 682. Control unit 680 may translate value 682 to one or more values on configuration paths 682A-682D to initialize the inner PLL or to cause a change in the output frequency 535.

It may be observed that one or more of the points of control are also configuration points. Accordingly, each of the points of control may be implemented to contain an arithmetic unit (not shown), such as an adder, to add the pair of values that may be received on inputs 527X and 682X (X being one or A, B, C and D). The sum of the corresponding pair is then applied to the corresponding block, to cause PLL 500 to quickly change the output frequency 535 to a new value.

Control unit 680 may internally contain suitable digital logic and/or registers/memory for storing, computing and forwarding the corresponding values noted above. Additionally, control unit 680 may perform any format conversions prior to forwarding the corresponding values.

Thus, when a known frequency change is needed for the frequency of output clock out-clk 535 of PLL 500, the user provides values required to specify the change on paths 561 and 682. Respective control units 560 and 680 then generate corresponding values on one or more of respective sets of paths 562A-562C (and a path, not shown, to change frequency of clock source generating source clock 502) and 682A-682D to cause PLL 500 to effect the change.

The values needed to be provided on paths 561 and 682 may be pre-computed by the user since the new frequency is known a priori. Thus, the user may pre-compute the values for several known values of frequencies of output clock 535. The pre-computed values may be stored in either of control units 560 and 680.

Since the inner PLL 530 has a wide bandwidth, PLL 530 can quickly switch to generating out-clk 535 with the new frequency. By changing the corresponding 'configuration values' provided to outer PLL and the inner PLL, either simultaneously or with a slight time-gap in either order, PLL 500 can achieve a fast change in the frequency of out-clk 535. Such a capability of fast-switching may also be termed 'hitless switching'.

It is noted here that when not simultaneous, the time-gap between performing of the configuration changes to the outer (inner) PLL and the inner (outer) PLL is very small, and in general less than the settling time of the outer PLL, such settling time of the outer PLL being inversely related to the outer PLL's (small) bandwidth (BW). A general approximation is to consider the settling time to be equal to 1/BW. In practice, it is desirable to keep the time-gap as small as possible. As one example, the time-gap may be between a tenth to a hundredth of the settling time of the outer PLL. However, ideally, the time-gap is zero or very close to zero and the smallest realizable time-gap may depend generally on the implementation of the PLL and the circuitry as well as the communication path(s) operative for the configuration to occur, as would be obvious to one skilled in the relevant arts.

Denoting f ( ) as the frequency of a clock, the following relations illustrate how, in an example embodiment, the change in output frequency is achieved quickly by changing the divisor in the respective feedback dividers of the outer and inner PLLs. For example, if the current value of the divisor used by feedback divider 540 is k2, and if k2*42 is the change required in k2 to change to the desired new frequency f (new-out-clk) of out-clk 135, then:

f (new-out-clk)=k2*(1+Δ2)*f(ref-clk), wherein ref-clk is reference clock 506 of outer PLL 500.

If the current value of the divisor used by inner feedback divider 660 is k1, then to achieve the frequency change to f (new-out-clk), the new output frequency desired in out-clk is also expressed by:

f (new-out-clk)=k1*(1+control(t))*f(ref-ck); wherein ref-ck is the current frequency of reference clock 623 (ref-ck).

The change required in k1 is expressed by the function control (t). In the absence of any change to k1 directly by a user, control (t) represents the time-dependent correction that would occur normally due to the operation of the low bandwidth (and hence slow) main PLL loop 500. However, as noted above, the user also quickly/simultaneously changes (in addition to the change in k2) the divisor k1 to k1*(1+Δ1), wherein Δ1 represents the change in k1 required for effecting the desired change in frequency of out-clk. That is, the function 'control (t)' is replaced by a change to k1. Since the inner PLL 530 is very fast (high bandwidth), out-clk 535 is quickly changed to the new desired frequency.

It is noted here that instead of changing k1 of inner feedback divider 660, the fast change can also be achieved by changing the divisor of pre-scaler 620 via path 682B. Alternatively, both the divisors of pre-scaler 620 and inner feedback divider 660 can be changed by corresponding values. If oscillator 610 is implemented in a way that allows user-adjustment of the frequency of its output ref-ck, then a corresponding adjustment to the oscillator 610 can also be done instead of, or in addition to, the other configuration changes noted above.

When controlled oscillator 650 is implemented as a voltage-controlled oscillator (VCO), digital values can be written to control inputs of the VCO via path 682D to change the value of capacitances of the tuned circuits used within the VCO. When/if controlled oscillator 650 is itself implemented as another PLL (i.e., another level of nesting), then the corresponding divisor values, etc., can be changed in a similar manner to that noted above with respect to inner PLL 530. Any level/depth of nesting of PLLs can be used in place of controlled oscillator 530. In general, any parameter or value that can be user-controlled in one or more blocks of the inner PLL that enable a quick change in frequency of the output clock of PLL 500 can be changed, as would be apparent to one skilled in the relevant arts upon reading the disclosure herein.

The values of all of the configuration/change parameters (such as divisor values, etc.) of inner PLL 530 can be computed a priori in a known way by a user and saved in control unit 680, control unit 560 or a memory unit within PLL 500.

In the context of a nested PLL such as PLL 500, and assuming that arithmetic block 525 is not implemented (with frequency-correction signal 523 being directly provided to controlled oscillator 530), the filtered error signal (or frequency-correction signal) on path 523 of the outer/main PLL may be viewed as 'containing' the 'information' representing the frequency difference between the frequencies of the outer PLL's reference clock (e.g., ref-clk 506 of FIG. 5) and that of the inner PLL's reference clock (e.g., ref-ck 623 of FIG. 6). This may be understood as illustrated next.

The frequency of out-clk (535) is specified by the equation:

$$fout=(N*\text{f-inner-ref})$$

wherein,
fout is the frequency of the output clock,
f-inner-ref is the frequency of ref-ck (623) of the inner PLL,
N is the divide-ratio of the feedback divider 660 of the inner PLL, and
'*' represents the 'multiply' operation.

The frequency of the out-clk (535) must also satisfy the following equation:

$$fout=N2*\text{f-outer-ref},$$

wherein,
f-outer-ref is the frequency of the reference clock ref-clk (506) of the main/outer PLL, and
N2 is the divide-ratio of the feedback divider 540 of the outer PLL.

Starting with the outer PLL's loop opened at the output of LPF 520, the change from (N* f-inner-ref) to (N2*f-outer-ref) must take place once the outer loop is closed. In the absence of any changes made to the inner PLL's divisors/scaling factor, signal 523 would cause the change to happen slowly via operation of the slower outer loop (main PLL).

However, and as noted above with respect to PLL 500, the change can be forced to happen very quickly by changing the divisors (and/or pre-scaler scaling factor) of the inner PLL in addition that of the outer PLL, as described above. Thus, signal 523 effectively contains the information representing the difference between the frequencies of the reference signals of the outer PLL and the inner PLL. In other words, signal 523 contains the information (f-outer-ref minus f-inner-ref).

More specifically, once the inner PLL's feedback divider 620's divisor (and/or scaling factor of pre-scaler 620) has/have been changed to cause the fast switching of out-clk (535), signal 523 would quickly change to the required steady-state value, and have a magnitude (i.e., 'contain' the information) representative of the difference between the frequencies of the reference signals of the outer PLL and the inner PLL. Due to the signal 523 reaching steady-state value very quickly, the outer PLL would also reach steady-state quickly, and the frequency change is accomplished very fast (ideally instantly), as described above.

While the description above is provided in the context of nested PLLs, the techniques described herein can also be applied and implemented in the context of non-nested PLLs. One example of such a PLL is one in which controlled oscillator (e.g., 530) of a PLL (e.g., PLL 500) is an oscillator whose output frequency can be directly controlled by writing a digital value to a digital capacitor array in the controlled oscillator, with the value written to the digital capacitor array determining the output frequency.

IC 500 implemented as described above can be incorporated in a larger device or system as described briefly next.

6. System

Figure 7:
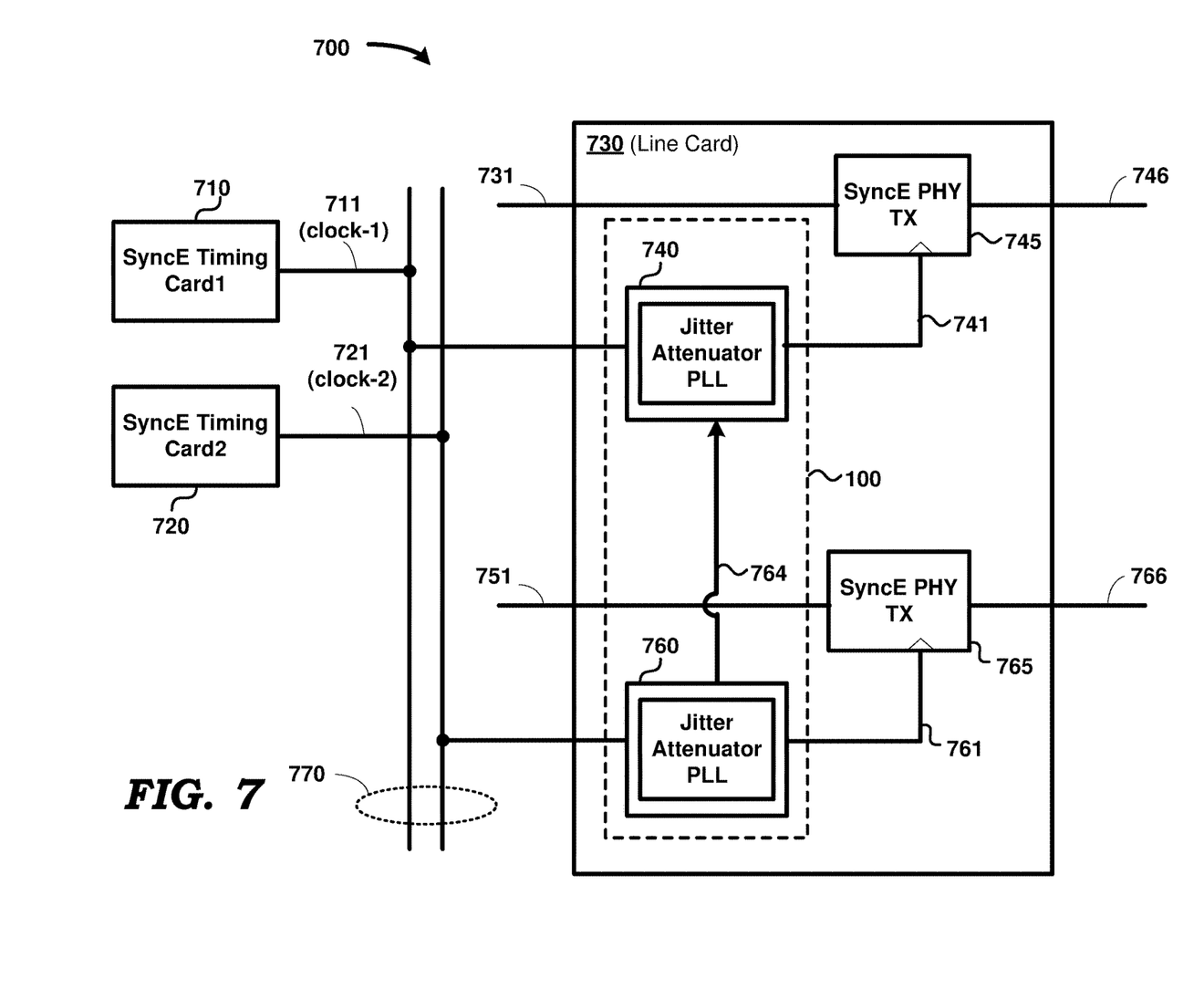
FIG. 7 is a block diagram of a system in which a multi-PLL device implemented according to several aspects of the present disclosure can be incorporated, in an embodiment of the present disclosure.

FIG. 7 is a block diagram of an example system containing IC 100 implemented according to various aspects of the present disclosure, as described in detail above. System 700 is shown containing SyncE (Synchronous Ethernet) timing cards (710 and 720) and line card 730. Line card 730 is shown containing IC 100, SyncE PHY Transmitter 745 and SyncE PHY Transmitter 765. Two PLLs of IC 100 are shown, namely jitter attenuator PLLs 740 and 760, which may respectively correspond to PLLs 110 and 120 of FIGS. 1 and 2.

The components of FIG. 7 may operate consistent with the Synchronous Ethernet (SyncE) network standard. As is well known in the relevant arts, SyncE is a physical layer (PHY)-based technology for achieving synchronization in packet-based Ethernet networks. The SyncE clock signal transmitted over the physical layer should be traceable to an external master clock (for example, from a timing card such as card 710 or 720). Accordingly, Ethernet packets are re-timed with respect to the master clock, and then transmitted in the physical layer. Thus, data packets (e.g., on paths 731 and 751) are re-timed and transmitted without any time stamp information being recorded in the data packet. The packets may be generated by corresponding applications such as IPTV (Internet Protocol Television), VoIP (Voice over Internet Protocol), etc.

Line card 730 receives a packet on path 731, and forwards the packet on output 746 after the packet has been re-timed (synchronized) with a master clock. Similarly, line card 730 receives another packet on path 751, and forwards the packet on output 766 after the packet has been re-timed (synchronized) with a master clock.

The master clock (711/clock 1) is generated by timing card 710. Timing card 720 generates a redundant clock (721/clock-2) that is to be used by line card 730 upon failure of master clock 711. Master clock 711 and redundant clock 721 are respectively provided via a backplane (represented by numeral 770) to PLLs 740 and 760 in IC 100.

The frequency-correction signal 764 of PLL 760 is routed via switch matrix 190 (not shown) and added to the frequency-correction signal of PLL 740. The sum is then applied to the controlled oscillator of PLL 740 in the manner described in detail above. As a result, even upon failure of clock 711, PLL 740 (then being set to hold-over mode) continues to provide a stable frequency output on path 741, and re-timing of packets received on path 731 is not affected by loss of master clock 711.

7. Conclusion

References throughout this specification to "one embodiment", "an embodiment", or similar language means that a particular feature, structure, or characteristic described in connection with the embodiment is included in at least one embodiment of the present disclosure. Thus, appearances of the phrases "in one embodiment", "in an embodiment" and similar language throughout this specification may, but do not necessarily, all refer to the same embodiment.

While in the illustrations of FIGS. 1 through 7, although terminals/nodes are shown with direct connections to (i.e., "connected to") various other terminals, it should be appreciated that additional components (as suited for the specific environment) may also be present in the path, and accordingly the connections may be viewed as being "electrically coupled" to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. An electronic block comprising:
    a plurality of independent Phase-Locked Loops (PLLs), each PLL having an input path and an output path, wherein each independent PLL generates a corresponding output clock locked to a respective input clock; and
    a switch matrix operable to concurrently connect a respective signal on the output path of each PLL to the input path of another PLL,
    wherein each PLL comprises:
        a phase detector and a low-pass filter, said low-pass filter operable to filter-out high-frequency components of an error signal generated by said phase detector and form a frequency-correction signal;
        a frequency-correction signal combiner to combine said frequency-correction signal with one or more frequency-correction signals received from any of the other PLLs to form a combined signal; and
        a controlled oscillator to generate said corresponding output clock of said PLL based on said combined signal,
    wherein said respective signal is said frequency-correction signal of the corresponding PLL, wherein said frequency-correction signal is in the form of a digital value, and said switch matrix is a digital switch matrix.

2. The electronic block of claim 1, wherein said plurality of independent PLLs comprise at least three PLLs, wherein each of the three PLLs is designed to receive the frequency correction signal of the remaining two PLLs and perform said combining.

3. The electronic block of claim 1, wherein said frequency-correction signal combiner is operable to combine two or more frequency-correction signals by any combination of arithmetic operations.

4. The electronic block of claim 3, wherein said arithmetic operations comprise addition and subtraction.

5. The electronic block of claim 4, wherein said frequency-correction signal combiner is further operable to filter one or more of said frequency-correction signals and said combined signal.

6. The electronic block of claim 5, wherein said plurality of independent PLLs comprises:
    a first PLL employing a first reference clock generated by a first high-stability clock source, said first PLL employing a first controlled oscillator to generate a first output clock, wherein said first controlled oscillator is a relatively low-stability clock source in comparison with said high-stability clock source; and
    a second PLL employing a second reference clock generated by a second high-stability clock source, said second PLL employing a second controlled oscillator to generate a second output clock, wherein said second controlled oscillator is a relatively low-stability clock source in comparison with said high-stability clock source,
    wherein a default frequency of said second controlled oscillator is equal to a default frequency of said first controlled oscillator, wherein said frequency-correction signal combiner of said first PLL combines a frequency-correction signal of said first PLL with a frequency-correction signal of said second PLL to generate said combined signal of said first PLL, wherein said combined signal of said first PLL controls said first controlled oscillator to generate said first output clock, wherein said first output clock is a high-stability clock in a normal mode of operation when said first reference clock is present, wherein, upon failure of said first reference clock, said first PLL operates in a hold-over mode to continue to provide said first output clock as said high-stability clock due to use of said combined signal of said first PLL to control said first controlled oscillator.

7. The electronic block of claim 6, wherein said first PLL comprises:
a first phase detector implemented as said phase detector, said first phase detector coupled to receive said second reference clock on a first terminal and a feedback clock on a feedback terminal, said first phase detector to generate a first error signal as said error signal, said first error signal representing a phase difference between said second reference clock and said feedback clock;
a first low-pass filter implemented as said low-pass filter, said first low-pass filter having a first passband to generate a filtered error signal as said frequency-correction signal by filtering said first error signal;
a first controlled oscillator implemented as said controlled oscillator, said first controlled oscillator coupled to generate said first output clock from said frequency-correction signal, wherein a frequency of said second output clock is determined by a strength of said frequency-correction signal;
a first feedback divider to divide said second output clock by a first divisor of a first value in a first interval,
wherein the loop formed by said first phase detector, said first low-pass filter, said first controlled oscillator and said first feedback divider has a first bandwidth,
wherein said first controlled oscillator is implemented as an inner PLL having a second bandwidth higher in magnitude compared to said first bandwidth, wherein said frequency-correction signal is provided as input signal to said inner PLL and said inner PLL provides said second output clock; and
a control unit to control operation of said first PLL and said inner PLL, wherein to switch to a different frequency of said first output clock, said control unit is designed to change a configuration of each of said first PLL and said inner PLL either simultaneously or with a slight time gap not exceeding a settling time of said first PLL to cause said first output clock to quickly change to said different frequency,
wherein, after failure of said first reference clock, said control unit changes configuration of each of said first PLL and said inner PLL either simultaneously or with said slight time gap, thereby also causing a frequency of said first output clock to quickly change to a new frequency.

8. The electronic block of claim 1, wherein said plurality of independent PLLs comprise at least a first PLL, a second PLL and a third PLL, and wherein said switch matrix couples the output path of each of said first PLL, said second PLL and said third PLL to the input path of the remaining two PLLs concurrently in a first duration, whereby the output path of said first PLL is coupled to the respective input paths of said second PLL and said third PLL in said first duration,
whereby the output path of said second PLL is coupled to the respective input paths of said first PLL and said third PLL in said first duration,
whereby the output path of said third PLL is coupled to the respective input paths of said second PLL and said first PLL in said first duration.

9. A system comprising:
a line card coupled to receive a first data packet, said line card to re-time said first data packet with reference to a first re-timing clock, and to transmit a first re-timed packet,
said line card coupled to receive a second data packet, said line card to re-time said second data packet with reference to a second re-timing clock, and to transmit a second re-timed packet;
a first timing card to generate a first clock; and
a second timing card to generate a second clock,
wherein said line card comprises an electronic block, said electronic block comprising:
a plurality of independent Phase-Locked Loops (PLLs), each PLL having an input path and an output path; and
a switch matrix operable to concurrently connect a respective signal on the output path of each PLL to the input path of another PLL,
wherein each PLL comprises:
a phase detector and a low-pass filter, said low-pass filter operable to filter-out high-frequency components of an error signal generated by said phase detector and form a frequency-correction signal;
a frequency-correction signal combiner to combine said frequency-correction signal with one or more frequency-correction signals received from any of the other PLLs to form a combined signal; and
a controlled oscillator to generate an output clock of said PLL based on said combined signal,
wherein said respective signal is said frequency-correction signal,
wherein a first PLL in said plurality of independent PLLs is coupled to receive said first clock, said first PLL to generate said first re-timing clock locked to said first clock, and
wherein a second PLL in said plurality of independent PLLs is coupled to receive said second clock, said first PLL to generate said second re-timing clock locked to said second clock.

10. The system of claim 9, wherein said frequency-correction signal is in the form of an analog signal, and said switch matrix is an analog switch matrix.

11. The system of claim 9, wherein said frequency-correction signal is in the form of a digital value, and said switch matrix is a digital switch matrix.

12. The system of claim 9, wherein said plurality of independent PLLs comprise at least three PLLs, wherein each of the three PLLs is designed to receive the frequency correction signal of the remaining two PLLs and perform said combining.

13. The system of claim 9, said frequency-correction signal combiner is operable to combine two or more frequency-correction signals by any combination of arithmetic operations.

14. The system of claim 13, wherein said arithmetic operations comprise addition and subtraction.

15. The system of claim 14, wherein said frequency-correction signal combiner is further operable to filter one or more of said frequency-correction signals and said combined signal.

16. The system of claim 15, wherein said first PLL employs a first reference clock generated by a first high-stability clock source, said first PLL employing a first controlled oscillator to generate a first output clock, wherein said first controlled oscillator is a relatively low-stability clock source in comparison with said high-stability clock source, wherein said second PLL employs a second reference clock generated by a second high-stability clock source, said second PLL employing a second controlled oscillator to generate a second output clock, wherein said second controlled oscillator is a relatively low-stability clock source in comparison with said high-stability clock source, wherein a default frequency of said second controlled oscillator is equal to a default frequency of said first controlled oscillator, wherein the frequency-correction signal combiner of said first PLL combines a frequency-correction signal of said first PLL with a frequency-correction signal of said second PLL to generate said combined signal of said first PLL, wherein said combined signal of said first PLL controls said first controlled oscillator to generate said first output clock, wherein said first output clock is a high-stability clock in a normal mode of operation when said first reference clock is present, wherein, upon failure of said first reference clock, said first PLL operates in a hold-over mode to continue to provide said first output clock as said high-stability clock due to use of said combined signal of said first PLL to control said first controlled oscillator.

17. The system of claim 16, wherein said second PLL comprises:
a first phase detector implemented as said phase detector, said first phase detector coupled to receive said second reference clock on a first terminal and a feedback clock on a feedback terminal, said first phase detector to generate a first error signal as said error signal, said first error signal representing a phase difference between said second reference clock and said feedback clock;
a first low-pass filter implemented as said low-pass filter, said first low-pass filter having a first passband to generate a filtered error signal as said frequency-correction signal by filtering said first error signal;
a first controlled oscillator implemented as said controlled oscillator, said first controlled oscillator coupled to generate said first output clock from said frequency-correction signal, wherein a frequency of said second output clock is determined by a strength of said frequency-correction signal;
a first feedback divider to divide said second output clock by a first divisor of a first value in a first interval,
wherein the loop formed by said first phase detector, said first low-pass filter, said first controlled oscillator and said first feedback divider has a first bandwidth,
wherein said first controlled oscillator is implemented as an inner PLL having a second bandwidth higher in magnitude compared to said first bandwidth, wherein said frequency-correction signal is provided as input signal to said inner PLL and said inner PLL provides said second output clock; and
a control unit to control operation of said second PLL and said inner PLL, wherein to switch to a different frequency of said second output clock, said control unit is designed to change a configuration of each of said second PLL and said inner PLL either simultaneously or with a slight time gap not exceeding a settling time of said second PLL to cause said second output clock to quickly change to said different frequency,
wherein, after failure of said first reference clock, said control unit changes configuration of each of said second PLL and said inner PLL either simultaneously or with said slight time gap, thereby also causing a frequency of said first output clock to quickly change to a new frequency.

18. The system of claim 9, wherein said plurality of independent PLLs comprise at least a first PLL, a second PLL and a third PLL, and wherein said switch matrix couples the output path of each of said first PLL, said second PLL and said third PLL to the input path of the remaining two PLLs concurrently in a first duration,
whereby the output path of said first PLL is coupled to the respective input paths of said second PLL and said third PLL in said first duration,
whereby the output path of said second PLL is coupled to the respective input paths of said first PLL and said third PLL in said first duration,
whereby the output path of said third PLL is coupled to the respective input paths of said second PLL and said first PLL in said first duration.

19. An electronic block comprising:
a plurality of independent Phase-Locked Loops (PLLs), each PLL having an input path and an output path, wherein each independent PLL generates a corresponding output clock locked to a respective input clock; and
a switch matrix operable to concurrently connect a respective signal on the output path of each PLL to the input path of another PLL,
wherein each PLL comprises:
a phase detector and a low-pass filter, said low-pass filter operable to filter-out high-frequency components of an error signal generated by said phase detector and form a frequency-correction signal;
a frequency-correction signal combiner to combine said frequency-correction signal with one or more frequency-correction signals received from any of the other PLLs to form a combined signal; and
a controlled oscillator to generate an output clock of said PLL based on said combined signal,
wherein said respective signal is said frequency-correction signal of the corresponding PLL.

20. The electronic block of claim 19, wherein said frequency-correction signal is in the form of an analog signal, and said switch matrix is an analog switch matrix.

* * * * *